(12) United States Patent
Timans

(10) Patent No.: US 7,745,762 B2
(45) Date of Patent: Jun. 29, 2010

(54) OPTIMIZING THE THERMAL BUDGET DURING A PULSED HEATING PROCESS

(75) Inventor: Paul Janis Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 796 days.

(21) Appl. No.: 11/443,464

(22) Filed: May 30, 2006

(65) Prior Publication Data

US 2006/0289433 A1 Dec. 28, 2006

Related U.S. Application Data

(60) Provisional application No. 60/686,506, filed on Jun. 1, 2005.

(51) Int. Cl.
*F27B 5/14* (2006.01)
*C23C 16/00* (2006.01)

(52) U.S. Cl. .................. 219/390; 219/405; 219/411; 392/416; 392/418; 118/724; 118/725; 118/50.1; 118/728; 118/729; 118/730

(58) Field of Classification Search .............. 219/390, 219/405, 411; 392/416, 418; 118/725–5, 118/50.1, 728–30
See application file for complete search history.

(56) References Cited

U.S. PATENT DOCUMENTS

| | | | |
|---|---|---|---|
| 4,350,537 A | 9/1982 | Young et al. | |
| 4,356,384 A | 10/1982 | Gat | |
| 4,415,794 A | 11/1983 | Delfino et al. | |
| 4,649,261 A | 3/1987 | Sheets | |
| 4,698,486 A | 10/1987 | Sheets | |
| 5,119,760 A | 6/1992 | McMillan et al. | |
| 5,160,575 A | 11/1992 | Chen | |
| 5,308,594 A | 5/1994 | Chen | |
| 5,561,735 A | 10/1996 | Camm | |
| 5,645,646 A * | 7/1997 | Beinglass et al. | ........... 118/730 |
| 5,705,224 A | 1/1998 | Murota et al. | |
| 6,383,902 B1 | 5/2002 | Niemann et al. | |

(Continued)

OTHER PUBLICATIONS

PCT International Search Report for International Application No. PCT/US06/20813 dated Jun. 10, 2008.

(Continued)

*Primary Examiner*—Shawntina Fuqua
(74) *Attorney, Agent, or Firm*—Dority & Manning, P.A.

(57) ABSTRACT

An approach for optimizing the thermal budget during a pulsed heating process is disclosed. A heat sink or thermal transfer plate is configured and positioned near an object, such as a semiconductor wafer, undergoing thermal treatment. The heat sink is configured to enhance the thermal transfer rate from the object so that the object is rapidly brought down from the peak temperature after an energy pulse. High thermally-conductive material may be positioned between the plate and the object. The plate may include protrusions, ribs, holes, recesses, and other discontinuities to enhance heat transfer and avoid physical damage to the object during the thermal cycle. Additionally, the optical properties of the plate may be selected to allow for temperature measurements via energy measurements from the plate, or to provide for a different thermal response to the energy pulse. The plate may also allow for pre-heating or active cooling of the wafer.

56 Claims, 9 Drawing Sheets

U.S. PATENT DOCUMENTS

| | | |
|---|---|---|
| 6,594,446 B2 * | 7/2003 | Camm et al. ............... 392/416 |
| 6,849,831 B2 | 2/2005 | Timans et al. |
| 6,859,616 B2 | 2/2005 | Kususa et al. |
| 6,919,271 B2 | 7/2005 | Gat |
| 7,037,797 B1 | 5/2006 | Shooshtarian et al. |
| 7,045,746 B2 | 5/2006 | Devine et al. |
| 7,501,607 B2 | 3/2009 | Camm et al. |
| 2002/0195437 A1 | 12/2002 | Kusuda |
| 2003/0081945 A1 | 5/2003 | Kusuda |
| 2004/0105670 A1 | 6/2004 | Kusuda et al. |
| 2004/0178553 A1 | 9/2004 | Camm et al. |
| 2005/0023267 A1 | 2/2005 | Timans et al. |
| 2005/0047767 A1 | 3/2005 | Nozaki |

OTHER PUBLICATIONS

N. Acharya & P.J. Timans, "Fundamental Issues in Millisecond Annealing" (*Electrochemical Society*, Pennington, 2004), p. 11.

J. R. Logan, P. S. Dobson, C. Hill and P. J. Pearson, "Recrystallisation of Amorphous Silicon Films by Rapid Isothermal and Transient Annealing" (*Semicond. Sci. Technol.* vol. 3, (1988)) p. 437.

J. Murota, M. Sakuraba and S. Ono, "Silicon Atomic Layer Growth Controlled by Flash Heating in Chemical Vapor Deposition Using $SiH_4$ Gas" (*Appl. Phys. Lett.* vol. 62, (1993)) p. 2353.

N. C. Tung, "Application of Rapid Isothermal Annealing to Shallow p-n Junctions via $BF_2$ Implants" (*J. Electrochem. Soc.* vol. 132, (1985)) p. 914.

\* cited by examiner

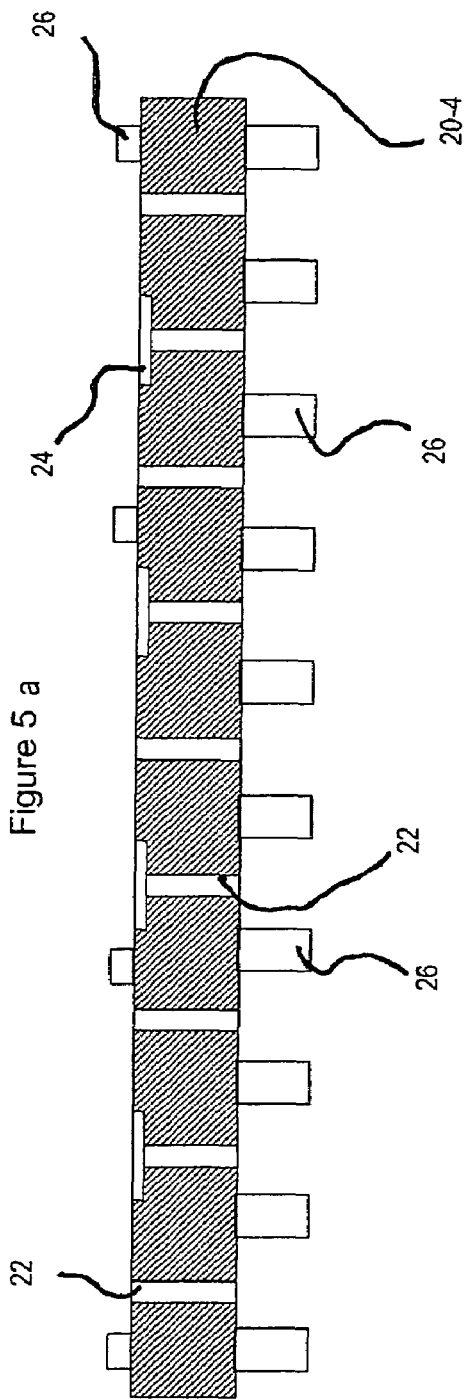
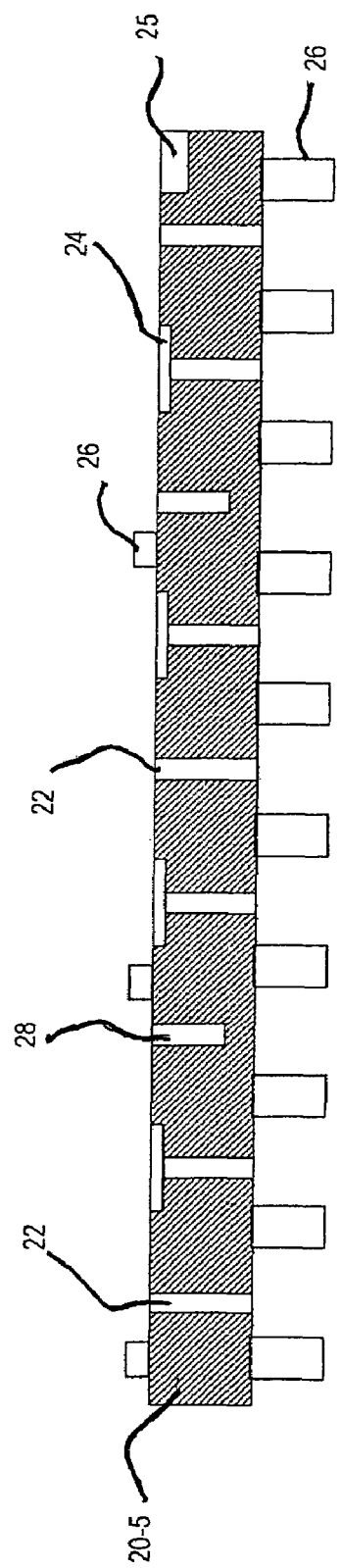

OPTIMIZING THE THERMAL BUDGET DURING A PULSED HEATING PROCESS

CROSS-REFERENCE TO OTHER APPLICATIONS

This application claims priority to U.S. Provisional Patent Application No. 60/686,506, filed Jun. 1, 2005, and hereby incorporates by reference that provisional patent application in its entirety.

BACKGROUND OF THE INVENTION

The production of semiconductor devices requires precise control of material properties. Often, the production of such devices involves controlled heating of semiconductor materials. For instance, during the production process, semiconductor wafers (and other devices) may be subjected to an ion implantation process or processes that dope the wafer with impurities. After the ions have been implanted, the crystal lattice structure of the wafer is annealed by heating the wafer to a high temperature. Other typical processes utilizing heat treatment include growth and deposition of film layers, crystallization, and phase change processes.

However, heat treatment, especially at higher temperatures, can have many undesirable side effects. For example, in an annealing process, the high temperatures may lead to an undesired diffusion of the dopant atoms, which will lead to unpredicted or unwanted semiconductor properties. While such diffusion may occur in the course of any heat treatment process, it may be especially troublesome when a pulse of energy is used to heat-treat a wafer.

If the pulse of energy is delivered to the wafer surface over a time scale that is short, relative to the time that is necessary for heat to diffuse through the thickness of the substrate, then the surface of the wafer will become substantially hotter than the opposite surface. For a typical silicon wafer that is ~775 µm thick, that is at a temperature of ~800° C., such surface heating is achieved when the energy is absorbed within a region that is less than 200 µm below the surface of the wafer, when the pulse is of less than ~20 ms duration. For a large effect, the energy should be absorbed within less than 20 µm from the surface and the pulse typically should be less than 5 ms in duration.

Immediately after the energy from the pulse is absorbed, the heat diffuses through the thickness of the wafer, raising the average temperature of the wafer as a result. This temperature rise occurs over a timescale defined by the rate of heat diffusion through the thickness of the wafer, which is typically ~50 ms for a wafer at 800° C. that is 775 µm thick, as is typical for 300 mm diameter wafers. Hence pulsed heating produces a rather rapid rise in the temperature of the whole of the wafer. The subsequent evolution of the wafer temperature depends on the nature of the heat loss from the surfaces of the wafer into the surroundings. For example, if the back of the wafer is held in thermal contact with a heatsink structure, heat may be conducted away to the heatsink through the gap between the wafer and the heatsink. Alternatively, if the wafer is only supported at a few locations, and there are no cooler surfaces nearby, then heat may be lost from the surfaces by convection or conduction into the gas ambient surrounding the wafer, and by the emission of thermal radiation.

The rate at which heat is lost from the surface into the bulk of the wafer is typically very high, because thermal conduction within a solid is a very rapid and efficient mechanism of heat transfer. In contrast, transfer of heat from the wafer surface almost inevitably involves a thermal contact resistance that impedes the conduction of heat out of the wafer surface into a surrounding medium, or the relatively inefficient heat transfer mechanisms of convection or radiation. As a result, the bulk of the wafer tends to heat up after the pulse, and the thermal exposure (sometimes referred to as thermal budget) of the delicate structures within the wafer may be increased to an undesirable extent. Such thermal exposure may have deleterious effects such as introducing excessive diffusion of dopant species that have been introduced into the wafer. As a result there is a need to identify improved ways of limiting the thermal exposure of the wafer.

It is often desirable to combine the pulsed heating of the wafer surface with a second from of heating, called background heating, that preheats the wafer prior to application of the energy pulse. Typically such heating is useful because it enables the use of a lower energy pulse to achieve any desired degree of heating of the side of the wafer that is exposed to the pulsed heating process. The magnitude of the temperature pulse associated with the pulsed heating is also reduced, which leads to reduced stress within the wafer, as well as reducing the magnitude of any non-uniformity of heating associated with non-uniformity in the delivery of the energy pulse to the wafer surface. An example of the latter arises when the wafer is coated with materials that vary in composition across the surface that is exposed to pulsed heating. When such non-uniform coatings are exposed to an energy pulse, the magnitude of the resulting temperature non-uniformity decreases as the magnitude of the energy pulse decreases. Furthermore the ability to preheat the wafer allows the design of more sophisticated heating cycles, including the possibility of ramping this background temperature up to a given value and then applying the surface heating energy pulse. After the pulse, the background heating can be decreased and the wafer can cool. Various approaches are described in U.S. Pat. No. 6,849,831 and U.S. Pat. No. 6,594,446.

The ability to cool the wafer rapidly after the pulse of surface heating is clearly important for reducing the thermal exposure. Methods for limiting thermal exposure and improving cooling are described in U.S. Pat. No. 6,594,446, U.S. Pat. No. 5,561,735, U.S. patent application Ser. No. 10/629,400 filed Jul. 28, 2003, U.S. patent application Ser. No. 10/706,367 filed Nov. 12, 2003, U.S. patent application Ser. No. 10/646,144 filed Aug. 22, 2003, and U.S. patent application Ser. No. 09/527,873 filed Mar. 17, 2000.

SUMMARY OF THE INVENTION

A method of thermally treating an object includes providing an object in a thermal processing chamber and configuring a thermal transfer plate such that the plate has a thermal mass (i.e. heat capacity) that is no greater than about three times the thermal mass of the object. The thermal transfer plate is positioned in close thermal communication with the object and, after pre-heating, the object is heated by directing at least one pulse of energy toward the object for a duration of less than about 1 s. The thermal transfer plate enhances heat transfer from the object after the pulse has ceased by way of thermal conduction and allows for greater heat transfer away from the object than is available by radiative cooling of the object alone. In certain embodiments, the thermal transfer plate has a thermal mass no greater than the approximate thermal mass of the object.

The thermal transfer plate, also referred to as a heatsink herein, may comprise material such as silicon, silicon carbide, silicon nitride, silicon dioxide, aluminum oxide, sapphire, quartz, aluminum nitride, boron nitride, aluminum oxynitride, graphite, carbon, diamond, yttrium aluminum garnet, or other suitable materials, including ceramics and metals.

The object can be heated by a pulsed array of lamps, by scanning with a laser, or by other appropriate heating methodologies. The thermal transfer plate may be positioned such that the object rests directly upon it, or such that the plate and the surface of the object are approximately parallel to one another and define a gap. In certain embodiments, the gap distance is less than about 0.2 mm.

The cooling of the object may be further enhanced by disposing a material between the thermal transfer plate and the object, the material being a gas in certain embodiments. Preferably, the gas has a high thermal conductivity, and may, for example, comprise helium.

In some embodiments, different materials may be delivered into the gap such that the degree of thermal coupling between the object and the thermal transfer plate differs during the thermal treatment process.

The thermal transfer plate may be used for other portions of the treatment process, such as by pre-heating the object by emitting heat from the thermal transfer plate as part of the pre-heating process.

The thermal transfer plate may comprise additional features, such as a plurality of holes smaller than about 2 mm in diameter, or discontinuities in the plate surface, such as slits, ribs, recesses, protrusions, and holes that are preferably smaller than the thermal diffusion length associated with the treatment process in use. Furthermore, the surface of the plate can textured to further enhance heat transfer between the plate and the object.

The thermal transfer plate may be constructed in multiple pieces or parts, and may comprise a variety of materials or combinations thereof. In certain embodiments, the plate may be constructed such that it includes a material that undergoes a phase change at a selected temperature, the temperature selected to optimize heat transfer from the object.

The treatment process can further include augmenting the cooling by active measures, such as directing a cooling gas at the object or thermal transfer plate, either alone or in combination.

As part of the thermal treatment process, the temperature of the object may be monitored directly or indirectly by monitoring energy emitted, reflected, transmitted, or otherwise measured from the object and/or the thermal transfer plate. Such monitoring can include the use of optical sensors such as pyrometers.

A system for thermal treatment of an object within a chamber is disclosed, the system including a heating arrangement configured to direct a pulse of energy towards a surface of an object, such as a semiconductor wafer. The energy may be produced utilizing an array of lamps or a scanning energy source such as a laser. The system also includes a thermal transfer plate positioned parallel to a surface of the object, the plate having a thermal mass no greater than about three times the thermal mass of the object. In other embodiments, the thermal mass, or heat capacity, of the plate is no greater than the approximate thermal mass of the object. The object may rest directly on the plate, or may be spaced apart from the plate by a defined gap; in some embodiments, the gap distance is less than about 0.2 mm.

The gap may be filled, partially or entirely, with a material selected to enhance the thermal transfer rate between the object and the heat sink, such as a gas with a high thermal activity. Helium may be one such gas delivered into the gap.

The system may further comprise an additional heat source configured to pre-heat the object. The additional heat source can in some embodiments be a thermal transfer plate configured to generate and emit heat, or may comprise a separate source which pre-heats the object indirectly via the plate.

The system can further include a measurement device or devices configured to monitor the temperature of the object based on energy emitted, transmitted, reflected, or otherwise associated with the object and/or the thermal transfer plate.

Embodiments of the method for thermal treatment of objects may be applicable to processing semiconductor wafers using a pulsed energy source, and may achieve a specific thermal profile through selection and placement of a heat sink or thermal transfer plate having a specified thermal mass and/or other defined thermal characteristics. Such a method includes placing a semiconductor wafer into a rapid thermal processing chamber, preheating the wafer, and subjecting the wafer to at least one pulse of energy for less than about 1 s, such that the average temperature of the semiconductor wafer increases by a temperature difference $\Delta T$ between the average temperature of the wafer just prior to the pulse ($T_1$) and the maximum average temperature of the wafer after the pulse has ceased ($T_2$). The heat transfer from the wafer after the pulse is enhanced beyond what cooling could be achieved otherwise. Such enhancement is obtained by placing a thermal transfer plate in close thermal communication with the wafer. The plate may be configured to have a thermal mass no greater than approximately three times the thermal mass of the wafer, and be appropriately configured and positioned so that the average temperature of the wafer decreases from $T_2$ by at least 50% of the value of $\Delta T$ within 1.0 s.

In certain embodiments, $T_1$ may be about at least 600° C. and $\Delta T$ may be at least 50° C. In other embodiments, the temperature of the wafer decreases by 50% of $\Delta T$ within 0.5 s, and in still further embodiments within 0.3 s.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures, in which:

FIGS. 5a and 5b depict side views of still further exemplary thermal transfer plates.

DETAILED DESCRIPTION OF THE INVENTION

Figure 1:
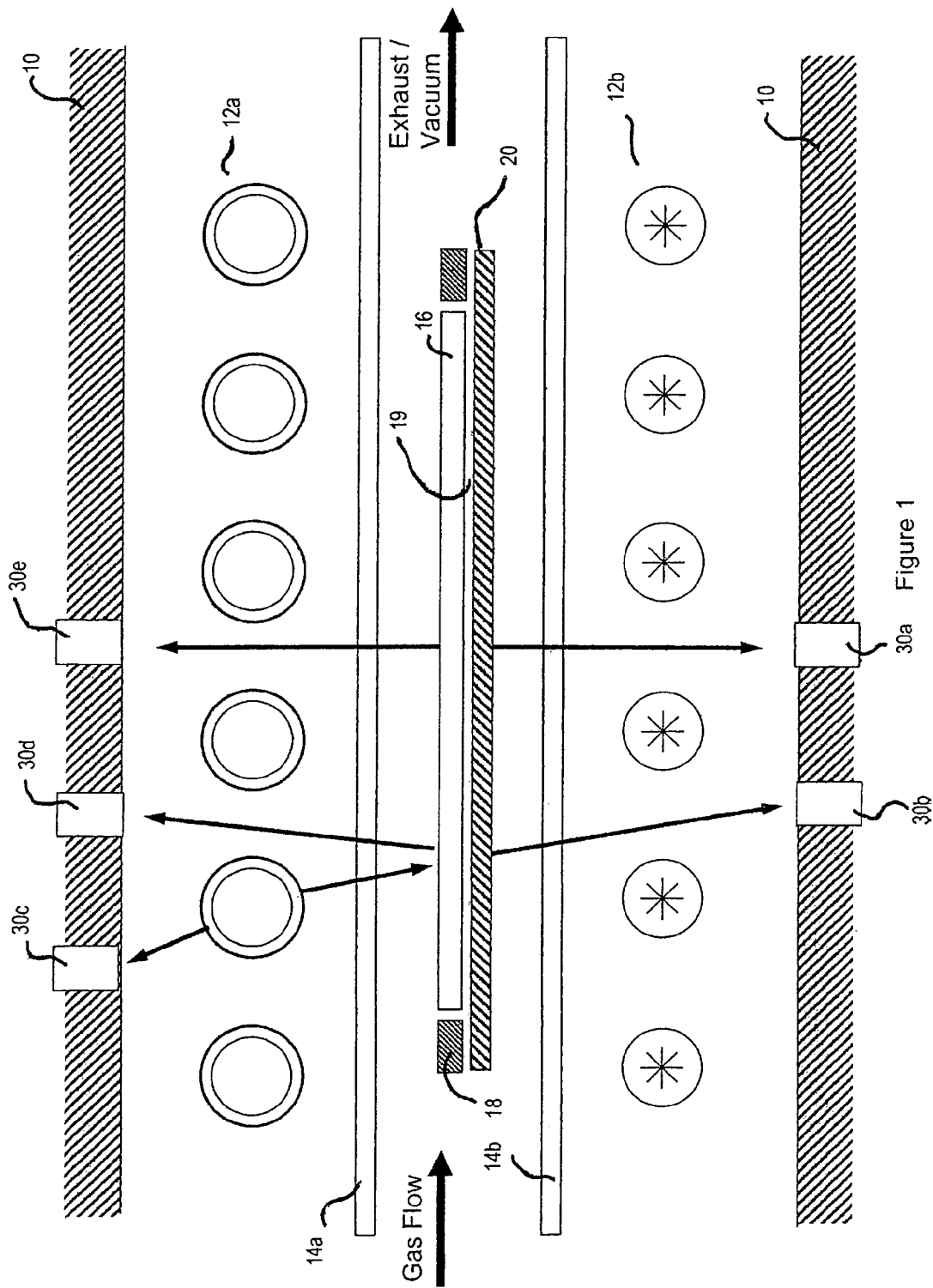
FIG. 1 illustrates a side view an exemplary processing chamber including a thermal transfer plate.

Reference will now be made in detail to embodiments of the present invention, one or more examples of which are illustrated in the accompanying drawings, with like numerals representing substantially identical structural elements. Each example is provided by way of explanation, and not as a limitation. In fact, it will be apparent to those skilled in the art that modifications and variations can be made without departing from the scope or spirit of the disclosure and claims. For instance, features illustrated or described as part of one embodiment may be used on another embodiment to yield a still further embodiment. Thus, it is intended that the invention disclosed herein includes modifications and variations as come within the scope of the appended claims and their equivalents.

Several approaches may be of interest in the context of more precisely controlling thermal budget during pulsed surface heating cycles. It should be recognized that these approaches will be useful regardless of how the pulsed heating is implemented, and hence the methods may be used in combination with a wide variety of heating sources, modes of processing and heating configurations. For example they can be applied to pulsed heating with energy from lamps, lasers, other electromagnetic energy sources (e.g. RF, microwave, millimeter-wave, THz radiation sources), particle beams, gas flows, plasmas, flames, chemical reactions, phase changes etc. They can also be applied regardless of how the energy impinges on the surface of the wafer. For example the energy may be applied to the whole of a wafer surface, or to selected regions of the surface. It may also be applied by scanning an energy source across the wafer surface, or by exposing the wafer to a series of pulses in localized regions. The pulse duration can range from $10^{-15}$ s to ~1 s, with typical applications involving pulses with durations between 10 μs and 10 ms. The peak temperatures of the wafer surface would lie between 50° C. and 2000° C., with typical applications involving processing between 900° C. and 1400° C.

The efficiency of heat transfer from the wafer can be increased by a variety of means. For example, if the wafer is held in close proximity to a heatsink that is maintained at a given temperature, then the conductive heat transfer between the wafer and this heatsink can be improved by introducing a material with a high thermal conductivity between the wafer and the heatsink. For example, a good thermal bond can be introduced by a metallic element or alloy. This is especially true for materials that are soft and easily deform to fill in the space between the wafer surface and the heatsink surface, thus accommodating any surface roughness or non-planarity of either the wafer or the heatsink. Similar benefits arise from using a material that is liquid at the temperature of interest. Improved thermal contact can also be achieved through applying pressure to the wafer or heatsink, forcing them into more intimate contact. Such pressure may arise from mechanical clamping, inertial forces, electrostatic clamping or by gas pressure or by a vacuum chuck.

Although these approaches may improve conductive heat transfer, they also introduce some problems. For example, many of the best solids or liquids that could improve heat transfer between the wafer and the heatsink, such as liquid or soft metals, may tend to react with the wafer or contaminate it with undesirable impurities. Furthermore, most materials may leave some residue on the back or edges of the wafer after processing, which would have to be removed in a cleaning process. Although cleaner materials may be found that leave little contamination on the wafer, for example elastomer materials, the temperature range of their use may be quite restricted for some applications.

An alternative, discussed in more detail below, is to employ a gas to transfer the heat. For example, by introducing a gas of high thermal conductivity, such as a gas with a conductivity greater than about 0.1 $Wm^{-1}K^{-1}$ into the gap, then some of the benefits of improved heat transfer can be retained. Suitable gases can include He, $H_2$, $D_2$ and mixtures thereof. Other gases, including lower thermal conductivity gases such as $N_2$, $O_2$, $H_2O$, $D_2O$, $NH_3$, $N_2O$, NO, HCl, $SiH_4$, $Si_2H_6$, $GeH_4$, $CH_4$, $CF_4$, $C_2H_6$, $C_2H_2$, $C_2H_4$, $C_3H_8$, $CO_2$, CO, $NF_3$, Ne, Ar, Kr and Xe, could also be used, for example in mixtures for controlling the thermal conductivity of the mixture or to "switch" the heat transfer conditions and hence adjust the wafer temperature. The gases may be used to affect the heat transfer conditions between the wafer and the plate, or between the wafer and the chamber, but they can also be used to assist with processing the wafer. For example they can be used to assist with oxidation, nitridation, silicidation, compound formation, deposition of films, etching, reflow, annealing, altering surface topography etc. They can also be used to assist with cleaning the wafer or even other components in the process chamber. They can be used in mixtures, including mixtures such as $O_2$ and $H_2$ that can react to form water vapour, or mixtures that can promote deposition of films, for example by chemical vapour deposition. Small concentrations of $O_2$, for example, between 100 ppb and 10% may be combined with a second gas, such as $N_2$ or Ar, in order to help to control surface reactions during high temperature processes, for example by forming very thin oxide layers or by preventing thermal etching or dopant loss from the surface of the wafer. The gases can also be combined with chemically reactive species formed by delivering radiation or electromagnetic energy to the processing environment. For example radicals or ions may be formed by UV radiation or by generating a plasma. The gases in the chamber can be at elevated pressure (e.g. 10 atmospheres), atmospheric pressure, or at reduced pressure, e.g. down to pressures as low as 0.1 Torr. However, thermal conduction in gases becomes inefficient at pressures below ~1 Torr, and the method described here will be most effective above this pressure. The gases, their mixture and pressure can also be optimized to provide the best mechanical damping or cushioning with regard to the thermal deformation experienced by the wafer during a pulsed heating process. For example, this may be done by selecting optimal density and viscosity of the gas or gas mixture.

The heatsink itself may be made of a thermally conductive material, such as a metal, a semiconductor or a ceramic such as SiC. A high thermal conductivity helps to even out the temperature across the surface of the heatsink, hence leading to a more uniform temperature distribution across the wafer. It should be recognized that although we refer to a "heatsink" the heatsink may also act as a heat source for providing background heating as described above. In this context, the heat-sinking action would be more associated with absorbing the heat that was introduced by the pulsed heating process, which would otherwise raise the temperature of the wafer. The heatsink can include heating elements, for example resistive heating elements, and these can be arranged in separate independently controllable zones if it is desirable to tune the temperature uniformity of the heatsink. Furthermore, the heatsink can also include cooling channels if it is desired to extract large amounts of heat from the heatsink structure in a controllable way. The heatsink can contain both heating and cooling channels for optimal control of the temperature pattern and the thermal response of the heatsink structure. The heatsink can also contain elements for improving the wafer support, such as a series of passages for flowing gas or drawing vacuum. The flow of gas or application of vacuum through such passages can assist with the wafer support as needed. Furthermore, the heatsink can include an electrostatic chuck or other clamping means.

Optimization of heat transfer out of the wafer may also be useful in other ways. One difficult problem encountered when wafers are processed by the use of energy beams scanned across the wafer surface arises because of the thermal discontinuity at the edge of the wafer. Because a scanned beam inevitably generates a lateral temperature gradient parallel to the wafer surface there is always some lateral heat flow in this direction. As a result, as the beam approaches the edge of the wafer there is a "pile up" of heat near the edge, which can result in very large temperature non-uniformity or even wafer damage. One approach to improve this is to avoid scanning to the edge of the wafer, or to mask the edge from irradiation, but these approaches can also degrade uniformity or limit the region that can be processed. Another approach is to increase the scan velocity, so that the heat flow takes on a more "one-dimensional" pattern with thermal conduction through the wafer thickness dominating the heat flow. One criterion for ensuring operation in the 1-D heat flow regime is to make sure that the dwell time of the scanning beam is much smaller than the time for lateral diffusion over the width of the beam. For a beam of width 2b, and a scan velocity of V, the dwell time is $\tau \sim 2b/V$. The time taken for heat diffuse across the width of this beam can be estimated as $\sim(2b)^2/D_w$, where $D_w$ is the thermal diffusivity of the wafer at the background temperature of interest. Hence we reach a criterion $\tau \gg (2b)^2/D_w$. This can also be recast as a criterion relating the minimum scan speed to the dwell time, $V \gg (D_w/\tau)^{1/2}$. For silicon at ~800° C., $D_w \sim 10^{-5}$ m$^2$/s, so for a heating process with a dwell time of 1 ms, V should be greater than ~10 cm/s. The criterion can also be stated as a criterion on scan velocity for any given beam width, $V \gg D_w/(2b)$. For a beam width of 10 μm, V should be greater than 100 cm/s, whereas for a beam width of 200 μm, V should be greater than 5 cm/s. We should note in this discussion that many beams used for processing may not have sharp edges, and may for example have a Gaussian intensity profile. In such cases, beam width can be defined as a region containing the majority of the energy of the beam. For a Gaussian beam this could be the 1/e intensity width or the 1/e$^2$ intensity width, for example. Although the use of relatively high scan velocities and/or beam widths approximates a 1-D heat flow pattern, there is a penalty that the use of higher scan speeds or beam widths requires higher beam power in order to achieve the same peak temperature rise. This may be impractical, or it can limit the size of the region that can be covered in a scan. An alternative approach is to exploit the idea of enhancing heat transfer out from the wafer as discussed here.

In particular, it may be useful to enhance the heat transfer from the edge region in order to reduce the tendency for overheating near the edge of the wafer. For example, if the wafer is held on a heatsink that also serves to provide preheating, then the temperature distribution and heat flow in the heatsink can be tailored to enhance cooling at the edge of the wafer in the position that the beam would otherwise cause overheating. Another approach can involve providing better thermal contact between the edge of the wafer and a heatsink structure located in close proximity with the edge of the wafer. Any of the approaches discussed here can be used to enhance the lateral heat transfer from the wafer edge into a heatsink structure.

One difficulty with removing heat from the edge of the wafer arises from the thermal expansion of the wafer. If the wafer is loaded onto a heatsink that is used for preheating the wafer will expand to a degree that depends on the preheat temperature selected. Furthermore, there may be variation in the diameter of wafers. A fixed heatsink structure may be designed to fit the size expected for the wafer at the temperature of interest, but there is a risk that the wafer may become too large and press against the heatsink and break. Also there is a risk that the wafer is slightly too small and does not make adequate contact with the heatsink structure, causing inadequate cooling of the edge. These problems may be alleviated by using a compressible medium between the heatsink and the wafer, which can accommodate the size mismatch. Alternatively the heatsink could be spring loaded so that it maintains a constant pressure against at least the part of the wafer where it is needed. That part may not be the whole periphery of the wafer, since typically a scanning beam would not encounter the whole edge of the wafer at the same time.

We should also note that it is possible that in some cases, the reverse condition may be necessary, e.g. at locations where the heat transfer condition can cause underheating of the wafer. Such conditions may arise where a scan starts, because of the absence of lateral heat transfer "ahead of the scanning beam." Such non-uniformities may be at least partly compensated for by adjusting the temperature or heat flow distribution in the heatsink structure, and by employing a variable degree of heatsink at the wafer edge as necessary.

Although such approaches may be useful when a wafer is held on a heatsink, they are more difficult to apply to the case where the wafer is to be preheated or cooled at a high ramp rate, because a heatsink structure often may have a large thermal mass, which prevents the possibility of very fast changes in the background heating conditions. Although it is possible to provide improved cooling in this case by various means described in the patent applications mentioned above, or by other means such as the use of endothermic reactions at the wafer surfaces, further improvements are desirable.

An alternative approach is to use a much smaller thermal mass plate-like object as a "dynamic" heatsink that is also heated with the wafer. The wafer can sit on top of this plate, and it can either be in close proximity to the plate, or it can be held slightly above the plate, for example by standoffs or by a gas-cushion etc. It is not necessary that the plate acts as the mechanical support for the wafer, although such a configuration is possible.

This approach of using various heatsink plates (also referred to herein as "thermal transfer plates") will be described in more detail, with respect to the issue of controlling the thermal exposure of the wafer after surface heating of one side of the wafer. In one configuration, the heatsink plate is below the wafer and the top surface of the wafer is exposed to pulsed heating. If the heat transfer between the heatsink plate and the wafer is very efficient, then heat will rapidly pass from the wafer into the support plate, which will tend to raise the temperature of the heatsink plate while cooling the wafer.

FIG. 1 is a side view of an exemplary rapid thermal processing (RTP) chamber including reflective walls 10, lamps 12a and 12b, optical windows 14a and 14b, and wafer 16. Sensors 30e and 30a monitor the temperature of the wafer and the thermal transfer plate, and may comprise, for instance, optical pyrometers configured as known to one of ordinary skill in the art. Sensor 30c monitors the pulse radiation incident on the wafer. Sensor 30d monitors radiation reflected or scattered from the wafer and sensor 30b monitors radiation transmitted by the wafer. These sensors can be photodetectors or thermal detectors. Wafer 16 is separated from thermal transfer plate 20 by a gap 19 in this illustration, and is surrounded at least in part by edge ring 18. The skilled artisan will recognize that the edge ring 18 may include aspects presently disclosed in conjunction with the thermal transfer plate 20. For instance, ring 18 may contain cooling and/or heating features.

Depending on the composition of the system, gap 19 may vary in size or be omitted entirely (i.e. when the wafer sits directly on the thermal transfer plate). Gap 19 may be bridged partially or entirely by offsets, protrusions, or other features of the thermal transfer plate such that certain portions of the thermal transfer plate may be closer than others. Accordingly, as discussed herein, gap 19 refers generally to the distance between the wafer and the thermal bulk of transfer plate 20.

The skilled artisan will appreciate that the RTP chambers suitable for use with the present invention may include other additional components, such as gas flow valves, inlets, exhausts and other regulation components, and controllers such as computers for monitoring and controlling the treatment process. For instance, as shown in FIG. 1, the RTP chamber further includes appropriate components for directing gas flow across the wafer and through the gap 19.

Figure 2:
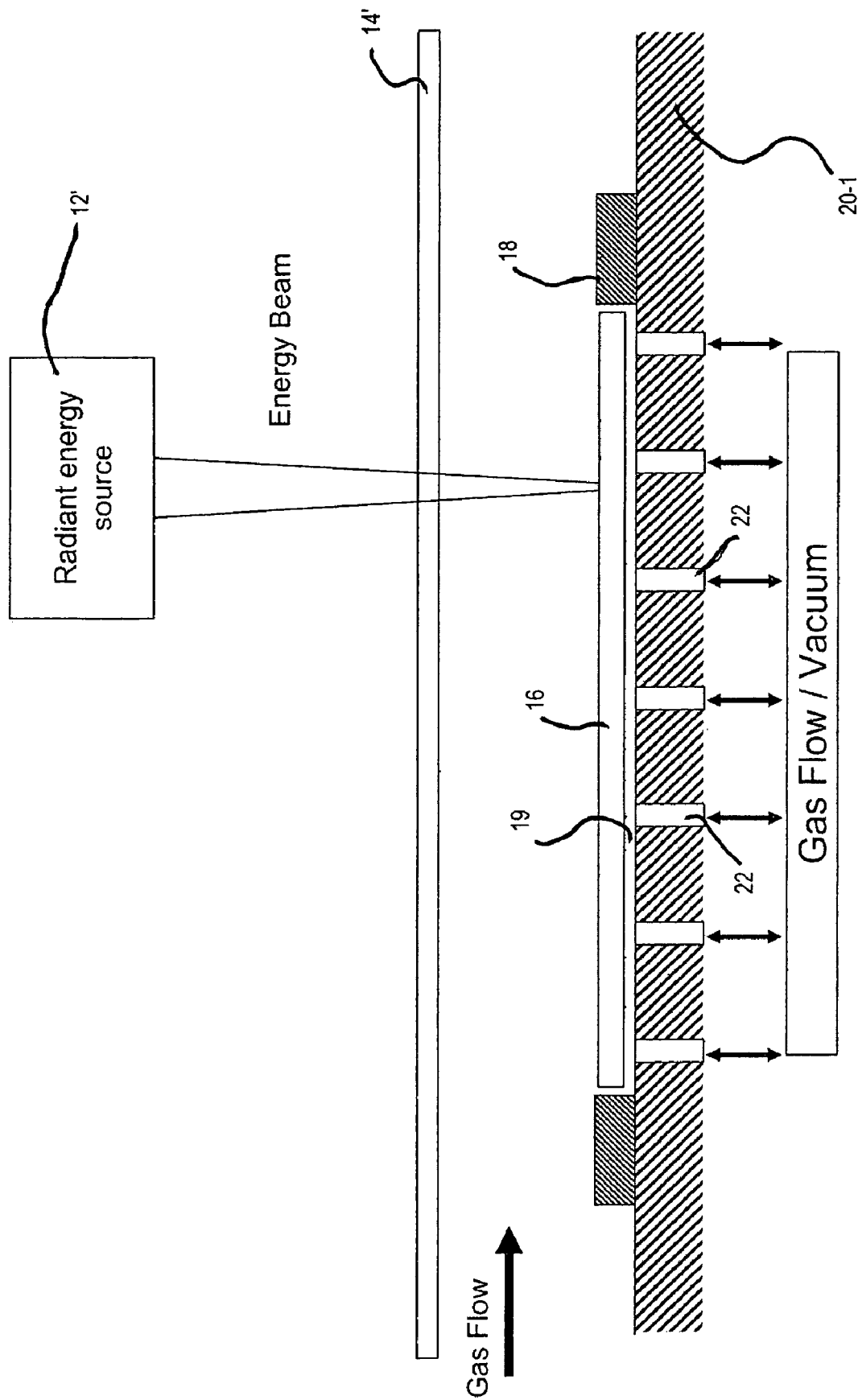
FIG. 2 illustrates another side view of an exemplary processing chamber including a thermal transfer plate.

FIG. 2 shows a side view of a second exemplary arrangement of an RTP chamber including a thermal transfer plate 20-1 comprising gas passages 22. Additionally, a gas flow/vacuum system is configured to direct gas through the passages 22 to and from the gap 19. The gas flow/vacuum system may furthermore apply a vacuum to the gap region 19 to remove gas. As will be discussed in detail below, such gas may be used to manage the thermal conductivity between the wafer and the thermal transfer plate. FIG. 2 also illustrates a radiant energy source 12', rather than an array of lamps, which is configured to heat the wafer 16 by scanning its surface.

Figure 3:
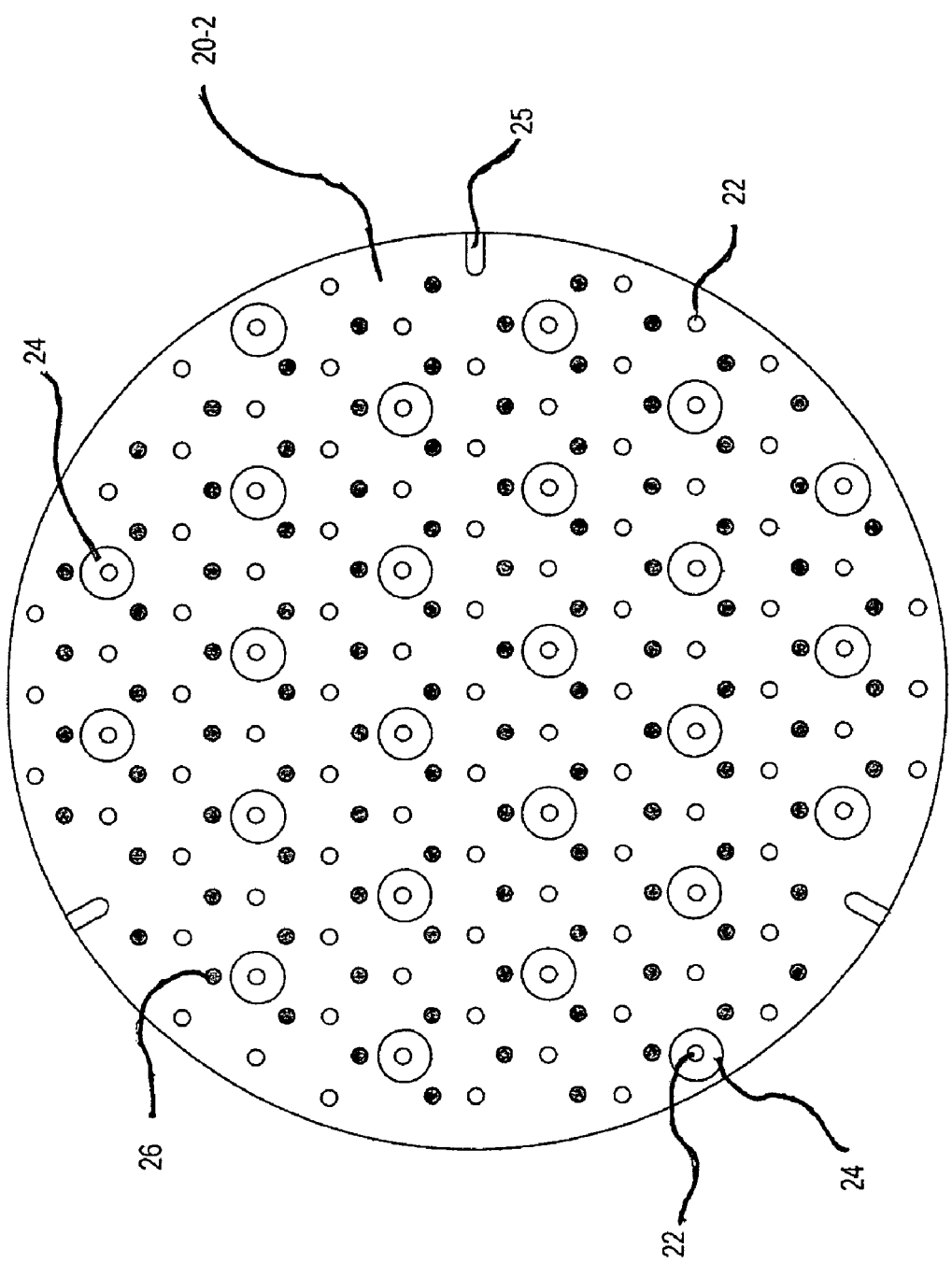
FIG. 3 illustrates a coaxial view of an exemplary thermal transfer plate.

FIG. 3 depicts an exemplary thermal transfer plate 20-2 as viewed coaxially, rather than from the side. Thermal transfer plate 20-2 includes gas passages 22, along with stand-off features 26, which may comprise ribs, islands, or other protrusions of material from the surface of the plate. Additionally, recessed regions 24 are scattered throughout the surface of the plate, some of which surround certain gas passages 22. Recessed regions 24 may be configured to alter cushioning effects of gasses passing through passages 22 and into the gap 19 between the thermal transfer plate and the wafer. Additionally, as discussed below, loading recesses or slots 25 may be configured to allow for easier loading or unloading of wafers by allowing clearance space for loading apparatus, such as robotic arms.

Figure 4:
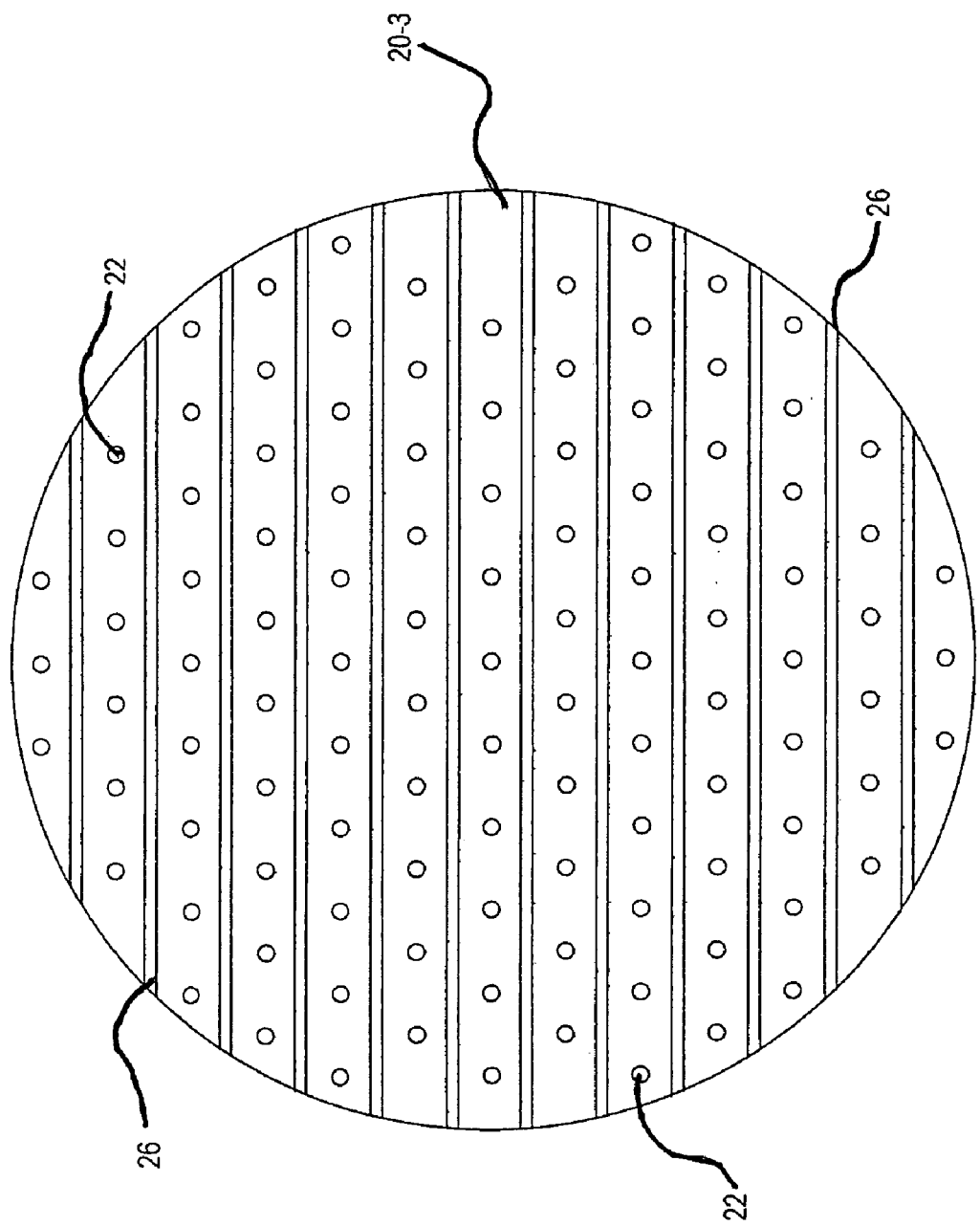
FIG. 4 illustrates a coaxial view of another exemplary thermal transfer plate.

FIG. 4 depicts another exemplary thermal transfer plate 20-3, again viewed coaxially. Plate 20-3 features gas passages 22 and a number of stand-off features 26, in this embodiment, a plurality of ribs. The features illustrated in the plate 20-2 of FIG. 3 and the plate 20-3 as shown in FIG. 4 may be the same on both sides of the plate, or may differ, depending upon the thermal characteristics desired for the RTP process. We should also note that although the density of the holes, ribs recesses etc is shown as fairly even in the figures, their density can be varied across the surface. This may be useful for varying the wafer support positions and the damping/cushioning effect of the gas layer between the wafer and the thermal transfer plate which may be useful to control the deformation of the wafer and the plate in response to the pulsed heating process.

Likewise the density of rib features and protrusions can be varied. This may be useful for varying the degree of flexibility of the plate, for example making a region of it more easily deformed than a second region of it. In general we should note that the flexibility of the plate can be optimized by selecting the material, thickness, surface coatings and construction (including the ribbing features and holes etc). Varying the density of the plates features can also help promote thermal uniformity, for example by allowing variation in the optical properties across the surface of the thermal plate, which can affect how it absorbs or radiates optical or thermal energy.

The optical properties of the plate can also be varied by applying coatings to all or parts of the plate's surfaces. For example, thin film coatings can be applied locally to a region of the plate to make it hotter or colder than a second region. Likewise, variations in the features of the plate, or even the materials used in construction of the plate, across its surface can be used to locally adjust the thermal mass per unit area of different regions of the plate. In the simplest case, the thermal mass per unit area is constant, and for most designs this would be kept similar to the thermal mass per unit area of the wafer (a typical range might be from 0.5 to 3 times the thermal mass of the wafer). However in some cases, the thermal mass may be higher in order to absorb more heat, or lower to absorb less heat. Such variations could be tuned to optimize the processing uniformity. We may note that the thermal mass per unit area of a plate of a thickness $D_{plate}$, with a specific heat capacity $C_{plate}$ and a density $\rho_{plate}$ is given by $\rho_{plate} C_{plate} D_{plate}$. Hence the thermal mass per unit area can be conveniently varied (either locally or across the whole of the plate) by varying any of these three parameters. It can also be varied by using additional layers or protrusions of other materials to vary the properties, or by introducing holes or gaps that reduce the average local thermal mass.

FIGS. 5a and 5b show side views of still further alternative embodiments of thermal transfer plates, in this case illustrated as 20-4 and 20-5, respectively. Both plates include a plurality of gas passages 22, stand-off features 26, and recessed areas 24, while FIG. 5b also includes a loading recess 25. Plates 20-4 and 20-5 further include recessed gas reservoir regions or blind holes 28, which may further alter the cushioning effect of the plate. Additionally, although not shown, reservoir regions 28 may be filled with a selected material and then sealed off in order to alter the thermal response of the transfer plate.

Operation of an RTP system using thermal transfer plates as discussed above will now be discussed in conjunction with the simulated temperature results shown in FIGS. 6 to 9.

Figure 6:
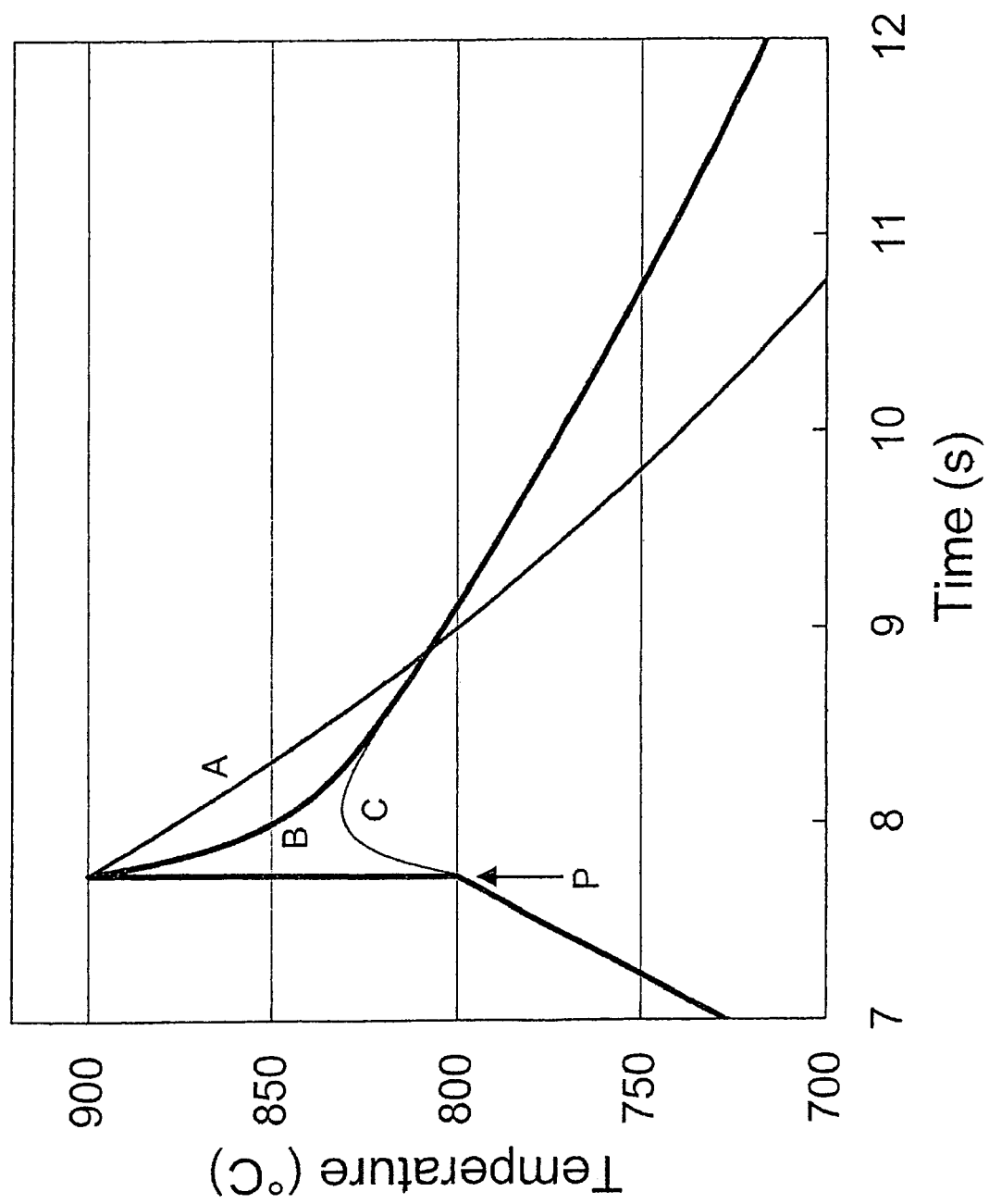
FIGS. 6-9 depict simulated temperature profiles over time for thermal processing systems.

FIG. 6 illustrates the concept with results from a simulation of the temperature-time cycles experienced by a wafer during a pulsed heating process both with and without a heatsink plate. Curve A shows the evolution of the average wafer temperature when it is processed without the plate. At the start of the heating cycle the wafer temperature is ramped up to 800° C., and then the pulse of energy is applied, and immediately after this all the heat sources are deactivated. The temperature profile shown does not directly show the surface heating itself, but the step up in average temperature at the point marked P indicates a relatively rapid rise in the average temperature that occurs shortly after the pulsed heat is delivered and diffuses through the wafer thickness. In the example considered here the resulting rise in bulk temperature is 100° C., so that the wafer is at 900° C. just after the heat from the pulsed heating process has spread through the thickness of the wafer. After the pulsed heating, it is assumed that the wafer cools by thermal radiation.

Curve B shows the trend of the wafer temperature when a heatsink plate 20 is present. In this case it was assumed that the heatsink plate had the same thermal properties and the same thickness as the wafer (775 μm), and that the space 19 between the wafer and the heatsink plate 20 was 100 μm and that it was filled with a medium with a thermal conductivity of 0.5 Wm$^{-1}$K$^{-1}$. This medium could, for example be a gas with a fairly high thermal conductivity introduced, for example, via gas passages 22 as shown in FIGS. 2-5, or otherwise directed into the space 19. Curve C shows the temperature-time profile for the heatsink plate itself, which matches that of the wafer during the ramp up. We see from curve B that when the heatsink plate is present, the initial cooling of the wafer from 900° C. is greatly accelerated, as a result of the rapid conduction of heat from the wafer into the heatsink plate. Curve C shows how the heatsink plate temperature rises as it absorbs heat from the wafer, and then the wafer and the heatsink plate reach a common temperature, after which point they cool at the same rate. We also see that the radiative cooling rate of the wafer is reduced by the heatsink plate, because the combination of the wafer and the heatsink plate has twice the thermal mass of the wafer alone. Hence the thermal exposure is actually greater, e.g. as the wafer cools to temperatures below ~800° C. in this example.

Despite this, the operation of the heatsink plate may still present advantages, because many of the undesirable processes that occur at high temperature, such as diffusion of dopant atoms, are thermal activated processes whose rate has an exponential dependence on temperature. As a result rapid cooling at higher temperatures is often much more important than the cooling rate at lower temperatures.

Figure 7:
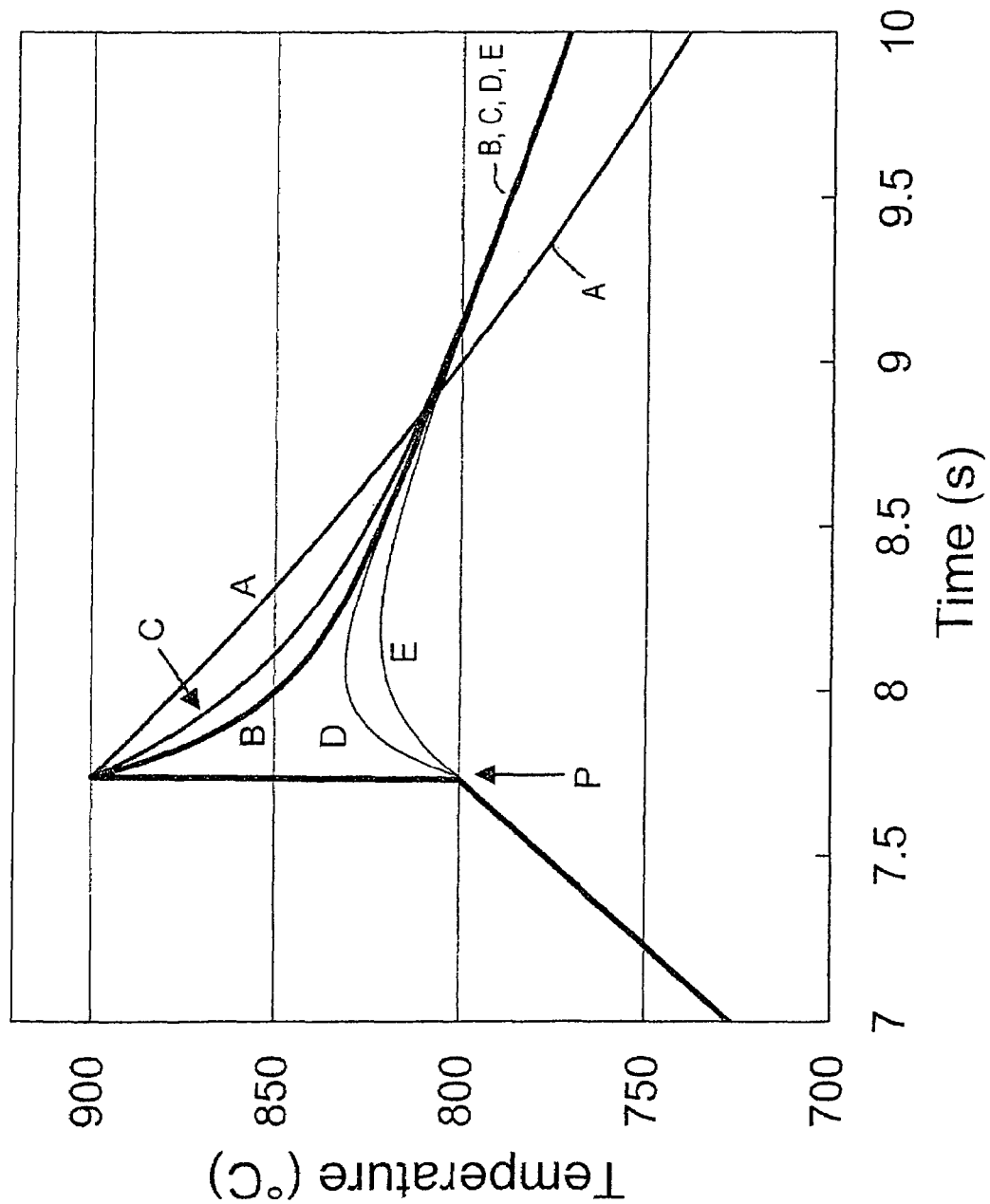

For fast cooling of the wafer, it is important that there be efficient heat transfer from the wafer to the heatsink plate. Although some heat will be transferred by thermal radiation, the most effective approach is to rely on thermal conduction through the medium between the wafer and the heatsink plate. Thermal conduction is enhanced by increasing the thermal conductivity of the medium between the wafer and the heatsink plate and by decreasing the size of the gap (19) between the two. FIG. 7 illustrates the effect of varying the size of the gap 19. In this case the medium is assumed to have a thermal conductivity of 0.5 $Wm^{-1}K^{-1}$ as in FIG. 6. Curve A is the temperature-time profile for a wafer without a heatsink plate, curve B is for the case where the heatsink plate is 0.1 mm away from the wafer and curve C is the case where the heatsink plate is 0.2 mm away from the wafer. Curves D and E are the temperature cycles for the heatsink plates when they are 0.1 or 0.2 mm away from the wafer, respectively. FIG. 7 shows that although the initial cooling rate is still enhanced when the plate is 0.2 mm from the wafer, the cooling efficiency is decreased as a result of the reduced rate of heat conduction across a larger gap.

Figure 8:
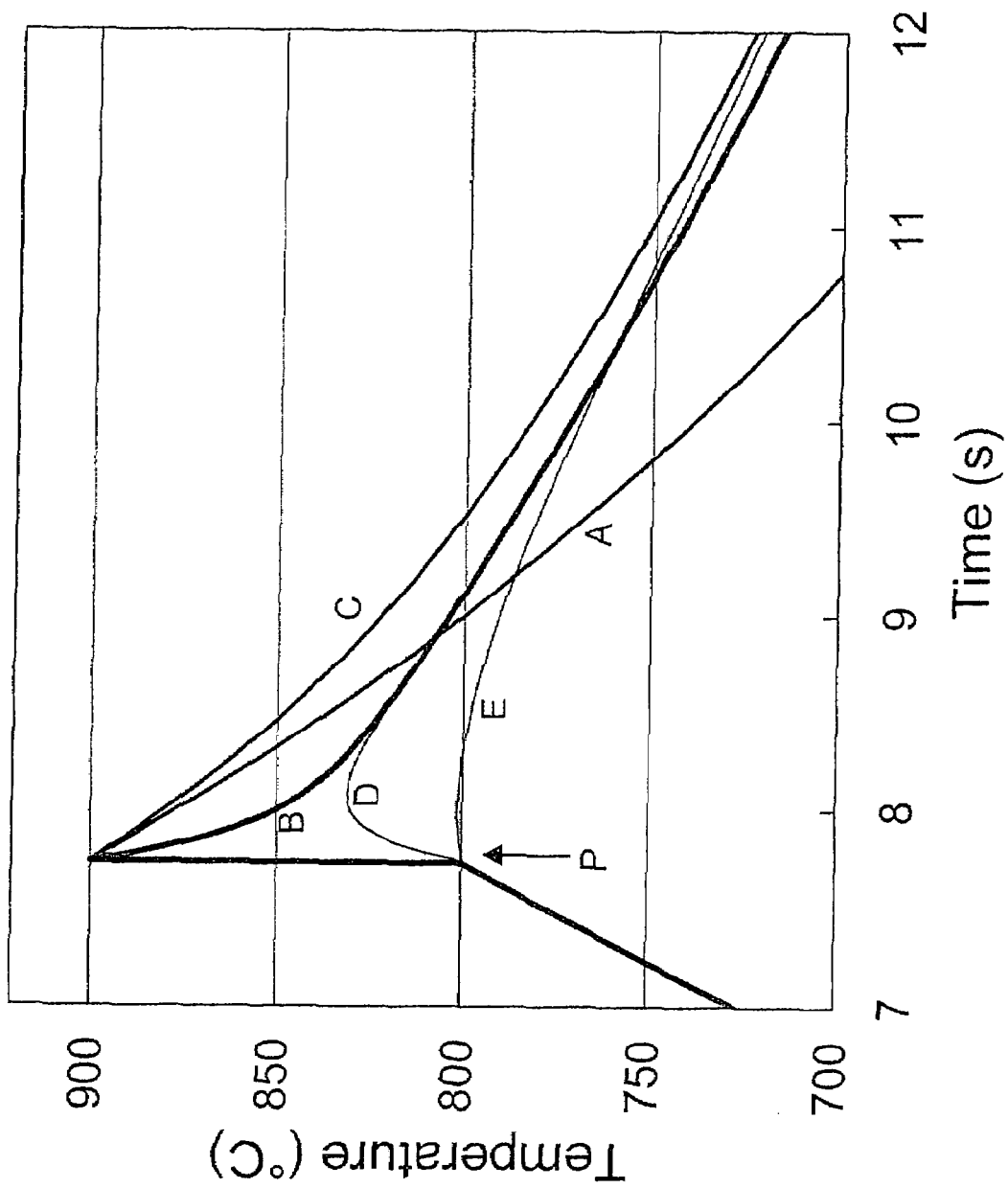

FIG. 8 shows the effect of the choice of the thermal conductivity of the medium between the wafer and the heatsink plate. Curves A, B, and D are the same as for FIG. 7. Curves C and E are the wafer and plate heating cycles respectively, for the case where the medium between the wafer and the plate has a thermal conductivity of only 0.05 $Wm^{-1}K^{-1}$. In this comparison we see that introducing the heatsink plate has slowed down the cooling rate. In order to use the heatsink plate concept in a medium with such a low thermal conductivity, the plate would have to be brought much closer to the wafer in order to increase the conductive coupling.

Figure 9:
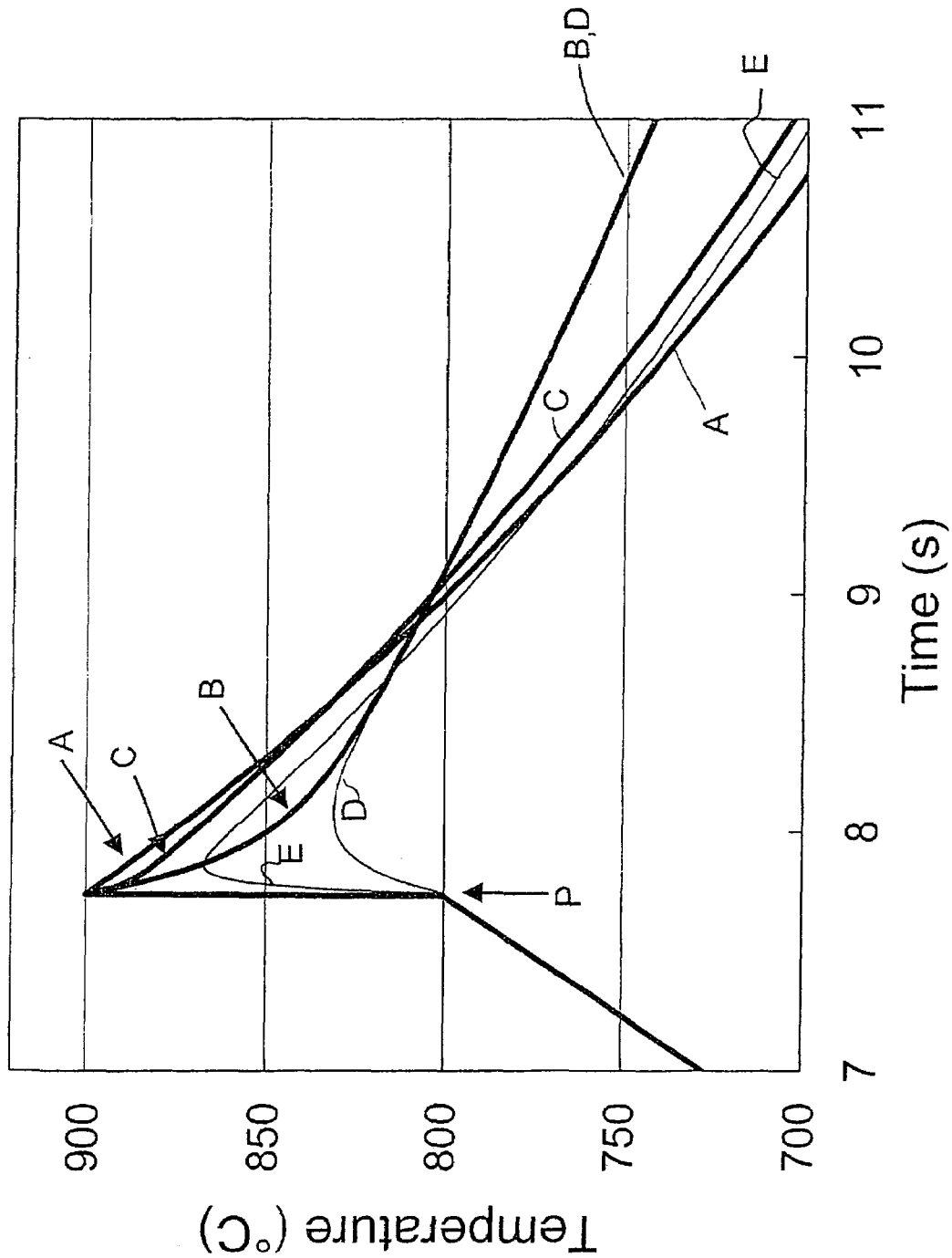

The degree of thermal exposure experienced by the wafer will also be affected by the properties of the heatsink plate. If the heatsink plate is made very thin or of low heat capacity, then it cannot absorb much of the extra heat introduced into the wafer by the pulsed heating and it does little to limit the temperature experienced in the wafer. FIG. 9 illustrates the issue by showing the behaviour for a case where the heatsink plate was chosen to be 100 μm thick. Curves A, B and D are the same as for FIGS. 7 & 8. Curve C is the wafer response with the heatsink plate present, and curve E is the corresponding response of the plate itself. Introducing the plate has provided a small improvement in the initial cooling rate, but the cooling rate becomes lower than that of a wafer alone once the temperature has dropped below ~830° C. The loss of cooling efficiency arises because the thin heatsink plate heats up very rapidly as heat transfers to it, as shown in curve E.

Although the initial cooling rate can be enhanced by using a thick heatsink plate or one with a large heat capacity, the ability to ramp the wafer up and down in temperature becomes limited, because of the large thermal mass of the heatsink plate. In practice it may be useful to accelerate the cooling rate of the wafer and the plate above that which is possible by radiation cooling alone. For example, a flow of gas directed at the wafer and/or at the thermal transfer plate can increase the rate of heat loss above that of radiation cooling alone. This gas flow can be applied throughout the whole heating cycle, or it can be initiated in timed relation to the preheating or pulsed heating steps. The gas cooling can be applied by increasing the rate at which gas flows into the chamber, or by flowing a gas that impinges directly on the surface of the wafer and/or on the heat transfer plate. For example a showerhead arrangement or an array of gas pipes can be used to direct gas cooling at the surfaces of the wafer and/or the thermal transfer plate. Alternative cooling mechanisms can also be used for cooling either the wafer or the heat transfer plate. For example, the cooling can be with a flow of a liquid, or a medium that experiences a phase change or an endothermic chemical reaction that can absorb thermal energy from the heat transfer plate or the wafer. In some cases such cooling may be more easily applied to the thermal heat transfer plate than the wafer, because the wafers surfaces must be kept very clean and uncontaminated with foreign materials. The heat transfer plate can also be designed to accommodate such cooling features that increase the rate of heat transfer from it and hence accelerate its cooling. The fact that the wafer and the heat transfer plate are in close thermal communication means that if the heat transfer plate can be cooled rapidly, then it in turn will cool the wafer rapidly. The heat transfer plate can even have connections that directly couple the flow of cooling media to its surfaces or its interior. For example it can have cooling channels within it. It can also have electrical connections if desired, which may permit the use of thermoelectric cooling methods. Such connections would also allow for including electrical temperature sensors such as thermocouples or temperature sensitive resistors. The various features of the heat transfer plate, such as the ribs described above can also be used to enhance its heat loss, for example by acting as cooling fins which increase the surface area available to dissipate heat. They can also increase the thermal emissivity and emitting area to increase the rate of radiation heat loss.

In general the thickness or heat capacity of the heatsink plate can be optimized with respect to the type of thermal cycle that is desired. The nature of the optimal thermal cycle will generally depend on the kinetics of the physical phenomena taking place during the thermal processing. An extra degree of optimization is possible by controlling the rate of heat transfer between the wafer and the heatsink plate, for example by controlling the gap between the two and the nature of the gas ambient between the two.

In some embodiments, it is not necessary for the heatsink plate to be ramped to the same temperature as the wafer before the pulsed heating is applied. Indeed, the rate of heat loss from the wafer can be increased by keeping the heatsink plate at a relatively low temperature compared to the wafer. This may help in reducing the need for close physical proximity between the wafer and the heatsink plate and the need for a high thermal conductivity medium between the two. For instance, a cooling gas may be directed toward or through the heatsink structure, such as via channels 22. Alternatively, the heatsink may include separate internal channels linked to a cooling system, such as the type of structure used in water-cooled lamps and the like. One complication with such approaches is that it may require separate control of the temperature of the wafer and the heatsink plate, for example by measuring their temperatures with pyrometers and controlling the heating and cooling sources accordingly.

If desired, the radiative properties of the heatsink plate can be optimized to ensure a different thermal response to that of the wafer. For example, the emissivity or absorptivity of the heatsink plate can be optimized to be greater or smaller than those for the wafer as desired. As noted previously, one approach for ensuring a different thermal response between the wafer and the plate can involve including a material within the heatsink plate that undergoes a phase change at a predetermined temperature in such a volume that it pins the temperature of the heatsink plate at that predetermined temperature. For instance, such a material could be sealed within reservoirs 28 of the heatsink structure, or could be otherwise incorporated into a chamber or other internal structure. Application of more heating to the plate would then merely drive the phase change while the plate temperature remained constant. This approach reduces the demands on the control system.

One advantage of using a configuration where the wafer and the heatsink plate are in close thermal contact is that the heatsink plate can also serve as a susceptor plate. If the thermal coupling between the wafer and the heatsink plate is strong enough, then the temperature of the heatsink plate can be used as an indicator of the wafer temperature. This may simplify the temperature measurement approach used for control of the process temperature. For example wafer back surfaces are often coated with films that affect their emissivity. As a result of this, pyrometric measurements of wafer temperature are often prone to error unless extensive precautions are taken to correct for emissivity variations. Since the heatsink plate can be made of a known material with a well characterized emissivity, it is possible to measure its temperature accurately with a pyrometer. If the thermal coupling between the wafer and the heatsink plate is such that only a small temperature difference can emerge between them during the period before the pulsed heating is applied, then the wafer temperature can also be closely controlled in this part of the heating cycle. This approach provides a simple approach for very repeatable preheating of the wafer. Even if the thermal coupling between the thermal transfer plate and the wafer is not perfect, it is possible to deduce the wafer temperature by measuring the temperature of the thermal transfer plate and then estimating the wafer temperature from a thermal model. This model can take account of the degree of thermal contact between the wafer and the thermal transfer plate, the nature of the medium between the wafer and the plate, and the optical or thermal energy entering or leaving the surfaces of the wafer and the thermal transfer plate. Estimates of the optical energy entering or leaving the wafer can be made more accurate through the use of measurements from sensors such as 30*b*, 30*c* and 30*d*.

An alternative approach for ensuring that the heatsink plate and the wafer are at similar temperatures is through the use of dual sided illumination, such as illustrated in FIG. 1. If the heatsink plate and the wafer have similar thermal masses then when they are illuminated with similar power densities from a dual sided heating system they will tend to follow similar thermal cycles. Lamps 12*b* may be controlled to pre-heat the wafer and thermal transfer plate. This preheating can also be combined with delivery of energy from lamps 12*a*. Then, a heat pulse may be provided using lamps 12*a* or another appropriate energy source. A combination of dual sided illumination and close thermal contact will provide even closer tracking of the temperatures of the wafer and the heatsink plate up until the pulsed heating is applied to the wafer.

One difficulty with the use of a heatsink plate arises from the need to load the wafer onto it. Close physical proximity prevents the use of a wafer loading mechanism that requires access between the plate and the wafer. The wafer could be loaded onto the plate through the use of a set of pins that pass through holes in the heatsink plate 20. The wafer also can be loaded onto the plate directly if the wafer is held at its edges with a mechanism that allows the wafer to be positioned over the plate and then lowered onto it. The heatsink plate could be adapted to facilitate such a mechanism, such as via the loading recesses or slots 25 illustrated in FIGS. 3 and 5*b*. The wafer could also be supported by an approach that holds it from above, such as a Bernoulli pick-up approach. Another approach can include loading the wafer onto a supporting element that holds the wafer near its edges and then bringing the heatsink plate into close proximity with the wafer. The component that the wafer sits on can be very thin, so that it fits between the heatsink plate and the wafer. Alternatively the heatsink plate can have cut out sections so that it doesn't interfere with the wafer support.

An alternative approach is to make the heatsink plate out of more than one part, so that it can be "pieced together" after the wafer is loaded onto part of it. For example, one part of the heatsink plate may have features for supporting the wafer at defined locations, such as the islands and ribs generally denoted as protrusions 26 in FIGS. 2-5. The protrusions can be designed to not interfere with the wafer loading mechanism. Once the wafer is loaded onto the supporting portion of the heatsink plate, the second part of the heatsink plate (and any further parts) can be put in place to complete the heatsink assembly.

Another difficulty may arise when unloading the wafer from the heatsink plate after processing as a result of the tendency of the wafer and the plate to "stick together" because of the relatively small gap between them, which impedes the flow of gas that is necessary to pull them apart. This problem may be alleviated by maintaining sufficient gap between the two, but that approach may compromise the cooling efficiency. Another approach would be to provide a series of holes in the heatsink plate which allow gas to flow through it, such as gas flow passages 22 and recessed areas 24 as shown in FIGS. 2-5. However, the number and size of the holes should be small enough to not affect the temperature uniformity on the wafer during the heating cycle. This is possible if the size of the holes is kept small enough that thermal diffusion can even out any temperature non-uniformity that tends to arise in the wafer, for example as a result of uneven heat transfer to the heatsink plate in the vicinity of the holes. This criterion can be met by making the hole size of approximately 2 mm or smaller, preferably less than 1 mm in size. The best uniformity can be achieved if the features are made small compared to the thermal diffusion length for the heating process of interest. This rule can be applied to any features in the heatsink plate, including those introduced to simplify loading or unloading of the wafer or the plate. It also can apply to any gaps between parts of any heatsink assembly that is pieced from sub-elements. It can also apply to the dimensions of protrusions 26 on the plate that may, for example, be used to provide stand-off features that set a gap between the wafer and the plate. We can also note that an approach of forming holes within the heatsink plate can also be used to optimize the thermal mass of the plate, and to affect its radiative properties.

Another issue that may be important arises from the tendency of the wafer or the plate to deform during thermal processing. The presence of the plate will affect this behaviour, and the design can be optimized to take account of the deformation behaviour. The use of a plate in close proximity to the wafer may reduce the tendency of the wafer to deform as a result of the thermal stresses generated during the heating process. The plate design can even be optimized to reduce deformation, for example by selecting a material that is relatively stiff or making the plate relatively thick. Other features can be used to determine the flexibility of the plate, such as ribs, recesses, protrusions or slits. Of course, the nature and dimensions such features would have to be optimized in conjunction with the thermal operation of the plate. For example, they can be made smaller than the thermal diffusion length associated with the process of interest, so that they do not degrade the uniformity of the thermal processing.

The heatsink plate can be constructed of a variety of materials, and its physical, thermal and optical properties can be optimized. One convenient choice for the plate is silicon, on account of its close match to the wafers properties, its good mechanical and thermal characteristics, and its high purity. The doping of the silicon can be selected to optimize the heat transfer characteristics. For example, the use of heavily doped silicon, with a resistivity below 0.1 Ωcm, can be employed in order to make the plate relatively opaque in the near infra-red, which may be useful if the plate's temperature is to be monitored with a pyrometer operating at a wavelength greater than ~1 μm. In contrast, if it is desirable to detect infra-red radiation that either emanates from the wafer or is transmitted by the wafer, for example to monitor the wafer temperature, then a lightly-doped silicon plate, with a resistivity greater than 0.1 Ωcm, which is transparent in the near infra-red region, could be employed. However, other materials may also be used, such as silicon carbide, silicon dioxide, silicon nitride, aluminium oxide, sapphire, quartz, aluminium nitride, boron nitride, aluminium oxynitride, graphite, carbon, diamond, yttrium aluminium garnet (YAG) or other ceramic materials of high purity. The plate may also be coated on any of its surfaces with layers that can enhance its properties. For example if the bulk material of the plate is not believed to be of sufficient purity or chemical resistance to the processing ambient, then it may be coated with a layer that serves as a barrier to out gassing of impurities or to chemical attack.

Coatings and surface modifications may also serve to optimize the thermal or optical properties of the plate. For example, if a pyrometer is used for measuring the temperature of the plate, then it may be useful to use a coating to form an antireflection layer for the wavelength of radiation that the pyrometer detects as a means for sensing temperature. This approach increases the emissivity of the plate, which can help to reduce errors in the temperature measurement that arise from reflection of stray radiation into the pyrometer system, as well as helping to define a high value of emissivity, which increases the signal detected by the pyrometer and improves accuracy. Optimization of the optical properties of the heatsink plate may also be useful in other ways. For example, the selection of the material and coatings can assist in defining the nature of the heating cycle. For example, selection of a material that is at least partially transparent to part of the radiation employed for heating would tend to reduce the temperature it reaches during the heating cycle relative to that of the wafer, and hence improve cooling efficiency. Another example would be to choose a material or a coating that increases the emissivity across the range of wavelength where the plate emits thermal radiation. This would increase the efficiency of the radiative cooling and can accelerate the cooling rate.

Another aspect that may help operation of the plate in certain conditions is preparation of the surface that faces the wafer in a manner so that the thermal conduction into the plate is more efficient. Under some heat transfer conditions the transfer of heat through a gas to a surface can be sensitive to the surface texture. In this case, it may be useful for that surface to be textured in a manner that improves the efficiency of heat transfer. Texturing may be performed by any conventional method that forms grooves, protrusions, and the like.

It is appreciated by persons skilled in the art that the present invention is not limited by what has been particularly shown and described above. Rather, as set forth in the attached claims, the scope of the present invention includes both combinations and sub-combinations of various features discussed herein, along with such variations and modifications as would occur to a person of skill in the art.

The invention claimed is:

1. A method of thermally treating an object, the method comprising:
   providing an object in a thermal processing chamber;
   positioning a thermal transfer plate in close thermal communication with the object, the thermal transfer plate having a thermal mass no greater than about three times the thermal mass of the object;
   pre-heating the object; and
   heating the object by directing at least one pulse of energy toward the object for a duration of less than 1 s such that the average temperature of the semiconductor wafer increases by a temperature difference $\Delta T$ to a peak temperature;
   wherein the thermal transfer plate is configured and positioned such that the cooling rate from the object is enhanced such that the average temperature of the object is brought down from the peak temperature by at least 50% of the value of $\Delta T$ within 1.0 s.

2. The method as set forth in claim 1, wherein the thermal transfer plate has a thermal mass no greater than the approximate thermal mass of the object.

3. The method as set forth in claim 1, wherein heating the object includes scanning the surface of the object with a laser.

4. The method as set forth in claim 1, wherein heating the object includes illuminating the object with at least one lamp.

5. The method as set forth in claim 1, wherein the thermal transfer plate comprises at least one material selected from the following group: silicon, silicon carbide, silicon dioxide, silicon nitride, aluminium oxide, sapphire, quartz, aluminium nitride, boron nitride, aluminium oxynitride, graphite, carbon, diamond, yttrium aluminium garnet (YAG).

6. The method as set forth in claim 1, wherein the thermal transfer plate is positioned such that the plate and a surface of the object are approximately parallel to one another and define a gap.

7. The method as set forth in claim 6, wherein the gap distance is less than about 0.2 mm.

8. The method as set forth in claim 6, further comprising: delivering a material into the gap to enhance thermal transfer between the object and the plate.

9. The method as set forth in claim 8, wherein the material comprises a gas.

10. The method as set forth in claim 9, wherein the gas has a thermal conductivity of at least 0.1 Wm-1K-1.

11. The method as set forth in claim 10, wherein the gas comprises helium.

12. The method as set forth in claim 8, wherein at least two different materials are delivered into the gap such that the degree of thermal coupling between the object and the thermal transfer plate differs during the thermal treatment process.

13. The method as set forth in claim 1, wherein pre-heating the object comprises emitting heat from the thermal transfer plate.

14. The method as set forth in claim 1, wherein the plate includes a plurality of holes smaller than about 2 mm in diameter.

15. The method as set forth in claim 1, wherein the plate includes discontinuities in the plate surface, wherein the discontinuities are smaller in size than thermal diffusion length associated with the process.

16. The method as set forth in claim 15, wherein at least one discontinuity is selected from the group consisting of: slits, ribs, recesses, protrusions, and holes.

17. The method as set forth in claim 1, wherein the surface of the plate is textured to further enhance heat transfer between the plate and the object.

18. The method as set forth in claim 1, wherein the interior of the plate comprises a material that undergoes a phase change at a selected temperature, the temperature selected to optimize heat transfer from the object.

19. The method as set forth in claim 1, further comprising: actively augmenting the cooling rate of the object.

20. The method as set forth in claim 19, wherein the cooling rate is augmented by directing a cooling gas toward the object.

21. The method as set forth in claim 20, wherein the cooling rate is augmented by directing the cooling gas toward the thermal transfer plate.

22. The method as set forth in claim 19, wherein the cooling rate is augmented by directing a cooling gas toward the thermal transfer plate.

23. The method as set forth in claim 1, further comprising monitoring the temperature of the object.

24. The method as set forth in claim 23, wherein the temperature of the object is monitored using at least one optical pyrometer.

25. The method as set forth in claim 1, wherein the temperature of the object is determined based on measuring energy from the thermal transfer plate.

26. A system for thermal treatment of an object within a chamber, comprising:
a heating arrangement configured to direct a pulse of energy towards a surface of an object; the pulse of energy configured to increase the average temperature of the object by a temperature difference $\Delta T$ between the average temperature of the wafer just prior to the pulse (T1) and the maximum average temperature of the wafer after the pulse has ceased (T2); and
a thermal transfer plate positioned parallel to a surface of the object, the thermal transfer plate having a thermal mass no greater than about three times the thermal mass of the object; the thermal transfer plate being positioned such that the average temperature of the wafer decreases from T2 by at least 50% of the value of $\Delta T$ within 1.0 s.

27. The system as set forth in claim 26, wherein the thermal mass of the thermal transfer plate is no greater than the approximate thermal mass of the object.

28. The system as set forth in claim 26, further comprising a heat source configured to deliver pre-heating energy to the object.

29. The system as set forth in claim 26, wherein the thermal transfer plate comprises at least one material selected from the following group: silicon, silicon carbide, silicon dioxide, silicon nitride, aluminium oxide, sapphire, quartz, aluminium nitride, boron nitride, aluminium oxynitride, graphite, carbon, diamond, yttrium aluminium garnet (YAG).

30. The system as set forth in claim 26, wherein the thermal transfer plate is spaced such that the thermal transfer plate and a surface of the object define a gap.

31. The system as set forth in claim 30, wherein the gap distance is less than about 0.2 mm.

32. The system as set forth in claim 31, wherein the gap is filled with a material selected to enhance the thermal transfer rate between the object and the thermal transfer plate.

33. The system as set forth in claim 32, wherein the material comprises a gas.

34. The system as set forth in claim 33, wherein the gas has a thermal conductivity of at least 0.1 Wm-1K-1.

35. The system as set forth in claim 34, wherein the gas comprises helium.

36. The system as set forth in claim 26, wherein the heating arrangement comprises an array of lamps.

37. The system as set forth in claim 26, wherein the heating arrangement comprises a laser configured to scan the surface of the object.

38. The system of claim 26, further comprising at least one temperature measurement device.

39. The system as set forth in claim 38, wherein the temperature measurement device comprises a pyrometer.

40. The system as set forth in claim 38, wherein the measurement device is configured to determine the temperature of the object based on measuring energy from the thermal transfer plate.

41. The system as set forth in claim 26, wherein the thermal transfer plate is configured to selectively act as a heat source.

42. The system as set forth in claim 26, wherein the thermal transfer plate includes a plurality of holes with diameters smaller than about 2 mm.

43. The systems set forth in claim 26, wherein the thermal transfer plate includes a discontinuity selected from the group consisting of: slits, ribs, recesses, protrusions, and holes; and wherein the discontinuity is smaller than the thermal diffusion length associated with the thermal treatment process.

44. The system as set forth in claim 26, wherein the thermal transfer plate comprises an interior and exterior, and at least a portion of the interior is configured to undergo a phase change at a selected temperature.

45. The system as set forth in claim 26, wherein the surface of the thermal transfer plate is textured.

46. A method of processing a semiconductor wafer, the method comprising:
placing a semiconductor wafer into a rapid thermal processing chamber;
pre-heating the semiconductor wafer to an average temperature T1;
after pre-heating, subjecting the semiconductor wafer to at least one pulse of energy for less than 1 s, such that the average temperature of the semiconductor wafer increases by a temperature difference $\Delta T$ between the average temperature of the wafer just prior to the pulse (T1) and the maximum average temperature of the wafer after the pulse has ceased (T2);
enhancing heat transfer from the wafer by placing a thermal transfer plate in close thermal communication with the wafer, the thermal transfer plate having a thermal mass no greater than about three times the thermal mass of the semiconductor wafer;
wherein the thermal transfer plate is configured and positioned such that the average temperature of the wafer decreases from T2 by at least 50% of the value of $\Delta T$ within 1.0 s.

47. The method as set forth in claim 46, wherein T1 is at least about 600° C.

48. The method as set forth in claim 46, wherein $\Delta T$ is at least 50° C.

49. The method as set forth in claim 46, wherein the average temperature of the wafer decreases from T2 by at least 50% of the value of $\Delta T$ within 0.5 s.

50. The method as set forth in claim 49, wherein the average temperature of the wafer decreases from T2 by at least 50% of the value of ΔT within 0.3 s.

51. A system for thermal treatment of an object within a chamber, comprising:
- a heating arrangement configured to direct a pulse of energy towards a surface of an object; and
- a thermal transfer plate positioned parallel to a surface of the object, the thermal transfer plate having a thermal mass no greater than about three times the thermal mass of the object; and
- at least one temperature measurement device.

52. The system of claim 51, wherein the temperature measurement device comprises a pyrometer.

53. The system of claim 51, wherein the measurement device is configured to determine the temperature of the object based on measuring energy from the transfer plate.

54. A system for thermal treatment of an object within a chamber, comprising:
- a heating arrangement configured to direct a pulse of energy towards a surface of an object; and
- a thermal transfer plate positioned parallel to a surface of the object, the thermal transfer plate having a thermal mass no greater than about three times the thermal mass of the object;
- wherein the thermal transfer plate includes a plurality of holes with diameters smaller than about 2 mm.

55. A system for thermal treatment of an object within a chamber, comprising:
- a heating arrangement configured to direct a pulse of energy towards a surface of an object; and
- a thermal transfer plate positioned parallel to a surface of the object, the thermal transfer plate having a thermal mass no greater than about three times the thermal mass of the object;
- wherein the thermal transfer plate includes a discontinuity selected from the group consisting of: slits, ribs, recesses, protrusions, and holes; and wherein the discontinuity is smaller than the thermal diffusion length associated with the thermal treatment process.

56. A system for thermal treatment of an object within a chamber, comprising:
- a heating arrangement configured to direct a pulse of energy towards a surface of an object; and
- a thermal transfer plate positioned parallel to a surface of the object, the thermal transfer plate having a thermal mass no greater than about three times the thermal mass of the object;
- wherein the surface of the thermal transfer plate is textured.

* * * * *